US007860141B2

(12) United States Patent
Noda et al.

(10) Patent No.: US 7,860,141 B2
(45) Date of Patent: Dec. 28, 2010

(54) PHOTONIC CRYSTAL LASER (75) Inventors: Susumu Noda, Kyoto (JP); Masahiro Imada, Kyoto (JP); Dai Ohnishi, Kyoto (JP)

(73) Assignees: Kyoto University, Kyoto (JP); Rohm Co., Ltd., Kyoto (JP)

( * ) Notice: Subject to any disclaimer, the term of this patent is extended or adjusted under 35 U.S.C. 154(b) by 195 days.

(21) Appl. No.: 11/919,344

(22) PCT Filed: Apr. 28, 2005

(86) PCT No.: PCT/JP2005/008173

§ 371 (c)(1),
(2), (4) Date: Nov. 20, 2007

(87) PCT Pub. No.: WO2006/117863

PCT Pub. Date: Nov. 9, 2006

(65) Prior Publication Data
US 2009/0034566 A1 Feb. 5, 2009

(51) Int. Cl.
H01S 5/00 (2006.01)
(52) U.S. Cl. .................... 372/46.01; 372/9; 372/20; 372/29.013; 372/29.015; 372/38.05; 372/39; 372/44.01; 372/81; 372/87
(58) Field of Classification Search .............. 372/9, 372/39, 81, 87, 20, 29.013, 29.015, 38.05, 372/44.01, 46.01
See application file for complete search history.

(56) References Cited
U.S. PATENT DOCUMENTS
5,684,816 A * 11/1997 Takagi ................. 372/44.01

(Continued)

FOREIGN PATENT DOCUMENTS
EP 0 903 822 A2 3/1999

(Continued)

OTHER PUBLICATIONS
Ide et al., "Continuous Output Beam Steering in Vertical-Cavity Surface-Emitting Lasers with Two p-Type Electrodes by Controlling Injection Current Profile," *Japanese Journal of Applied Physics*, vol. 38, No. 4A, pp. 1966-1970, Apr. 1999.

(Continued)

Primary Examiner—Minsun Harvey
Assistant Examiner—Yuanda Zhang
(74) Attorney, Agent, or Firm—Oliff & Berridge, PLC (57) ABSTRACT One objective of the present invention is to provide a laser device which is capable of scanning beams of a laser light of high output power at a high speed without using mechanical scanning mechanisms. A plurality of the upper electrodes 33 is linearly arranged in the photonic crystal laser provided with an active layer 21 and a two-dimensional photonic crystal layer 23 which are held between upper electrodes 33 and a lower electrode 27. A current is introduced from one upper electrode 33 or the plurality of the upper electrodes 33 disposed adjacently. Therefore, the active layer 21 generates light and the light is intensified by diffraction in the two-dimensional photonic crystal layer 23, so that a stronger laser light is emitted to the outside from around the upper electrodes 33 into which a current is introduced. When the current-injected upper electrodes are sequentially switched, a laser light scan is performed in the direction of the array of the upper electrodes. Since this switching can be made electrically, a laser light scan can be achieved at a high speed without using the mechanical scanning mechanisms.

14 Claims, 4 Drawing Sheets

U.S. PATENT DOCUMENTS

| | | | |
|---|---|---|---|
| 6,052,399 A | 4/2000 | Sun | |
| 6,665,322 B2 * | 12/2003 | Woodley | 372/29.02 |
| 6,826,223 B1 * | 11/2004 | Meyer et al. | 372/96 |
| 7,474,682 B2 * | 1/2009 | Mizuuchi et al. | 372/46.01 |
| 2004/0135155 A1 * | 7/2004 | Otsuka et al. | 257/79 |
| 2005/0056772 A1 * | 3/2005 | Kaneko | 250/214.1 |

FOREIGN PATENT DOCUMENTS

| | | |
|---|---|---|
| JP | A-01-239979 | 9/1989 |
| JP | A-06-196806 | 7/1994 |
| JP | A-07-321401 | 12/1995 |
| JP | A-8-97505 | 4/1996 |
| JP | A-2000-020995 | 1/2000 |
| JP | A-2000-332351 | 11/2000 |
| JP | A-2003-188460 | 7/2003 |
| JP | A-2003-273454 | 9/2003 |
| JP | A-2003-273456 | 9/2003 |
| JP | A-2003-273460 | 9/2003 |
| JP | A-2004-087980 | 3/2004 |
| JP | A-2004-228122 | 8/2004 |
| JP | A-2005-277219 | 10/2005 |
| WO | WO 02/073753 A2 | 9/2002 |

OTHER PUBLICATIONS

Japanese Office Action issued Oct. 26, 2010 for Japanese Patent Application No. 2004-090412 (w/translation).

* cited by examiner

PHOTONIC CRYSTAL LASER

TECHNICAL FIELD

The present invention relates to a laser element that can be preferably used for various kinds of devices such as laser printers, bar code readers or other devices where a laser light needs to be scanned, and a laser device.

Figure 1:
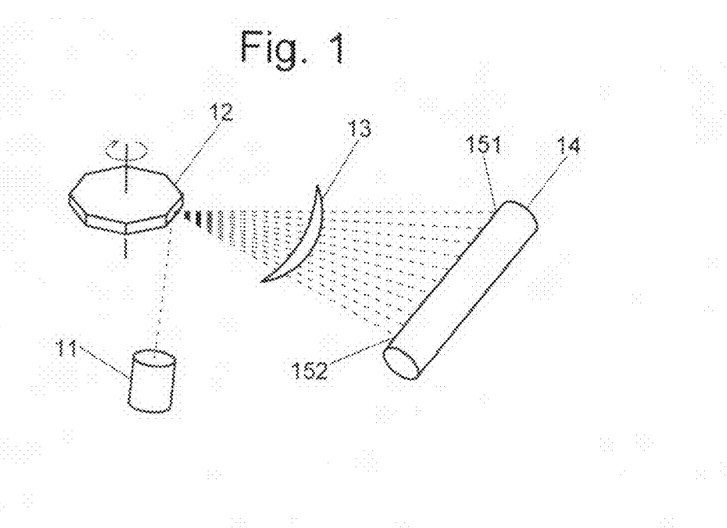
FIG. 1 is a schematic configuration diagram of a laser scanning device in a conventional laser printer using a polygon mirror.

In laser printers, bar code readers or other devices, a laser light is scanned in order to print data or read data. Explained here referring to FIG. 1 is a laser scanning device in conventional laser printers.

A laser light emitted from a semiconductor laser 11 is reflected on a side surface of a rotating polygon mirror 12, and passes through an f-θ lens 13 to irradiate a photoreceptor drum 14. While a laser light is irradiated onto one of the side surfaces of the polygon mirror 12, the irradiation point of the laser light (i.e. laser light spot) moves from one end 151 to the other end 152 of the photoreceptor drum 14 continuously due to the rotation of the polygon mirror 12. When the laser light spot reaches said the other end 152, the reflection of the laser light on the polygon mirror 12 is positioned exactly at an edge of the side surface of the polygon mirror. At the next moment, the reflection of the laser light is positioned at a beginning edge of the subsequent side surface, and thereby the laser light spot on the photoreceptor drum 14 returns to said one end 151. A laser light is thus irradiated on the photoreceptor drum 14 while being scanned repeatedly, during which the laser light is turned on/off, and characters and images are thus printed.

In order to accelerate the printing speed of laser printers, the scanning speed of the laser light spot on the photoreceptor drum needs to be increased. According to the above construction, the speed of the laser light spot scanned on the photoreceptor drum 14 is determined by the rotation speed of the polygon mirror. However, there are limitations to enhance the speed of such a mechanical motion, and it is difficult to accelerate the printing speed in the construction of FIG. 1.

Patent Document 1 discloses a construction which further enhances the scanning speed by using a laser light source where a plurality of vertical cavity surface emitting lasers (VCSELs) are arranged in the form of an array. According to this construction, the scanning speed is enhanced by emitting laser lights from the plurality of the VCSELs simultaneously. However, it is difficult to make VCSELs to be capable of moving the beams, and a polygon mirror is inevitable in scanning. Another problem is that the output of a single mode VCSEL is limited to about 3 mW.

In recent years, new types of lasers using a photonic crystal have been developed. A photonic crystal is made of a dielectric body in which an artificial periodic structure is created. Usually, the periodic structure is created by providing the dielectric body with a periodic arrangement of areas whose refractive index differs from that of the dielectric body. The periodic structure causes a Bragg diffraction within the crystal and creates an energy band gap with respect to the energy of light.

Patent Document 2 discloses a laser light source using a two-dimensional photonic crystal. This laser light source includes an active layer including a light-emitting material inserted between a pair of electrodes (or conductive semiconductor layers), and a two-dimensional photonic crystal located on an upper surface of the active layer. The two-dimensional photonic crystal is made of a plate member (or slab) whose refractive index is periodically distributed over a two-dimensional area. An injection of carriers from the electrodes generates light in the active layer, and the light is intensified by the diffraction due to the periodic structure of the two-dimensional photonic crystal, which causes a laser oscillation. When the distance of a period of the periodic structure is consonant with the wavelength in the medium, light is emitted in the direction vertical to the slab surface. This laser light source produces light emission whose output power is larger than that of the VCSEL.

[Patent Document 1] Unexamined Japanese Patent Publication No. 2000-020995 (Paragraph [0012], FIG. 2)

[Patent Document 2] Unexamined Japanese Patent Publication No. 2000-332351 (Paragraphs [0037] to [0056], FIG. 1)

DISCLOSURE OF THE INVENTION

Problems to be Solved by the Invention

One objective of the present invention is to provide a laser element and a laser device where beams of laser light of high output power can be scanned at a high speed without using mechanical scanning systems.

MEANS FOR SOLVING THE PROBLEM

A first aspect of a photonic crystal laser element according to the present invention that has been made to achieve the above-mentioned problem includes:

a) an active layer for generating light of a predetermined wavelength by an injection of electric charges;

b) a two-dimensional photonic crystal arranged on the upper side of the active layer and having a periodic structure corresponding to the predetermined wavelength;

c) a plurality of upper electrodes arranged on an upper side of the two-dimensional photonic crystal; and d) a lower electrode arranged on a lower side of the active layer.

A second aspect of the photonic crystal laser element according to the present invention includes:

a) an active layer for generating light of a predetermined wavelength by an injection of electric charges;

b) a two-dimensional photonic crystal arranged on the upper side of the active layer and having a periodic structure corresponding to the predetermined wavelength;

c) an upper electrode arranged on the upper side of the two-dimensional photonic crystal; and d) a plurality of lower electrodes arranged on the lower side of the active layer.

A photonic crystal laser device according to the present invention is provided with the above-described photonic crystal laser element, a voltage application means for applying a voltage between the upper electrode and the lower electrode, and a control means for controlling the on/off of the voltage applied to each of the plurality of the arranged upper electrodes or the lower electrodes.

Although the directivity employed here indicates the active layer in a lower position and the two-dimensional photonic crystal in a higher position, for the convenience of expression, both layers and other layers can be arranged in an arbitrary direction as long as the arrangement order is as stated above.

The photonic crystal laser element according to the present invention includes the active layer and the two-dimensional photonic crystal. This aspect is similar to that of the laser disclosed in Patent Document 2. The two-dimensional photonic crystal here does not need to be in direct contact with the active layer; it is possible to insert a spacer or other layers to obtain a sufficient feedback effect. Such a layer is inserted to adjust a distance between the active layer and the two-dimensional photonic crystal, so that size adjustments of a light-emitting area can be realized. An injection of electric charges causes the active layer to generate light of a predetermined wavelength. The active layer may use, for example, the same material as those conventionally used in Fabry-Perot laser light sources. The two-dimensional photonic crystal is generally made of a slab body provided with a large number of periodically arranged, same-shaped areas whose refractive index differs from that of the body material. The periodical structure is triangular, square, hexagonal lattice patterns or other patterns. The distance of a period is set to correspond to the wavelength of a light generated in the active layer. Although the periodic distance is generally set to match the wavelength of the generated light, there are cases where a laser oscillation is possible in other periodic distances (e.g. half of the wavelength).

The upper electrodes and the lower electrode are provided so as to sandwitch the active layer and the two-dimensional photonic crystal. Other layers may be inserted between the active layer and the lower layer.

In the photonic crystal laser element according to the first aspect, the plurality of the upper electrodes are separately arranged on the upper side of the two-dimensional photonic crystal. The upper electrodes may be arranged linearly (or one-dimensionally), or may be arrange two-dimensionally in a square lattice pattern, a triangular lattice pattern or other patterns. Other layers may also be inserted between the two-dimensional crystal and the upper electrodes. For example, the upper electrodes may be mounted onto a layer member arranged between two-dimensional photonic crystal and the upper electrodes.

A plurality of lower electrodes may be provided on the lower side of the active layer so as to correspond to the upper electrodes, or a single lower electrode common to the plurality of the upper electrodes may be provided. Other layers may also be inserted between the lower electrode(s) and the active layer. It is desirable that the lower electrode(s) or the inserted layer reflects light so as to avoid a leakage of light generated in the active layer from the lower electrode side to the outside.

A photonic crystal laser device is composed of the element thus constructed, and a voltage application means and a control means. The voltage application means is provided to apply a voltage between the upper electrodes and the lower electrode(s), where a usual DC power supply may be used. The control means is provided to control an on/off of the application voltage in each of the upper electrodes. The on/off timing in each of the upper electrodes may be appropriately determined in accordance with purposes of the photonic crystal laser as described in examples shown later.

Explanation is made for the operation of the photonic crystal laser device according to the present invention.

First explained is the mechanism of light emission of a laser light in the laser device. When a voltage is applied between one of the upper electrodes and the lower electrode, carriers are injected into the active layer placed between the upper electrode and the lower electrode, and the active layer generates light of a predetermined wavelength determined by the material of the active layer. The light is also introduced into the two-dimensional photonic crystal and diffracted by the periodic structure of the crystal corresponding to the wavelength. Therefore, the light of the wavelength is amplified and a laser oscillation occurs. The laser light is radiated from a certain range around the upper electrodes (i.e. light-emitting area) to the outside on the upper electrode side. It is also possible to confine the generated laser light in the vertical direction to allow extraction of the laser light from a side surface of the element.

In the photonic crystal laser element and the laser light source according to the present invention, operations which are not observed in conventional lasers can be realized due to the arrangement that a plurality of upper electrodes are provided. First, the light-emitting areas can be switched by the control means which controls the on/off of the application voltage in each of the upper electrodes, and thereby beams of the laser light can be apparently shifted.

Next, suppose that the size (or diameter) of a light-emitting area around an upper electrode is d, and when a large number of upper electrodes are disposed by setting the distance therebetween to be smaller than d, and a voltage is simultaneously applied (or turned on) to a predetermined number of adjacently disposed upper electrodes, these upper electrodes as a whole creates one light-emitting area (i.e. broad light-emitting area). When the on/off of the upper electrodes is switched one by one, or when a predetermined number of upper electrodes are switched as a whole and sequentially, the broad light-emitting area can be shifted gradually or stepwise. The former method allows smooth movement of the light-emitting area, and the latter method allows a prompt movement of the light-emitting area. In either method, the light-emitting area is broad and thereby a laser light of high output power can be generated.

While, normally, currents of the same amount are injected simultaneously to a plurality of electrodes, it is possible to diversify the amount of current injected to each of the electrodes in order to control the beam shape.

In order to extract a laser light from the upper electrode side in the laser element according to the present invention, it is desirable to use a transparent material in the upper electrode with respect to the light of the wavelength.

In the photonic crystal laser element according to the above construction, the irradiation range of a laser light is only within the entire length (or entire width) of the element because the laser light is radiated from the light-emitting area in a substantially vertical direction. Accordingly, if irradiation into a broader range is required, a means for changing the direction of a laser light outputted around each of the upper electrodes (deflection means) is desirably provided on the upper electrodes. The deflection means includes a lens to cover the entire element, a prism provided in each elements, and the like.

While explanation so far was made for the photonic crystal laser element and the laser device according to the first aspect in which a plurality of upper electrodes are arranged, a plurality of lower electrodes, instead of upper electrodes, may also be arranged. This represents the photonic crystal laser element and the laser device according to the second aspect. In this case, a single upper electrode common to the plurality of or the entire lower electrodes is sufficient. When a voltage is applied between each of the lower electrodes and the upper electrode, a laser light is radiated from the upper electrode to the outside in a range straightly above a predetermined range around respective lower electrodes. The operation of the photonic crystal laser element and the laser device according to the second aspect is the same as that of the first aspect.

Since light of a wavelength corresponding to the periodic structure of the photonic crystal is amplified within the photonic crystal, the wavelength of the laser light can be tuned by providing different periodic structures depending on positions within the photonic crystal.

According to the photonic crystal laser device of the present invention, the laser light can be scanned by turning on/off a voltage applied to the plurality of the arranged upper electrodes or lower electrodes without using mechanical scanning mechanisms. The scanning speed of the laser light is not limited by the speed of the mechanical scanning mechanisms, so that it can be larger than that of the conventional techniques. Moreover, using the photonic crystal laser capable of emitting light in large output power allows a sufficient increase in the intensity of an obtained laser light.

The photonic crystal laser of the present invention having such characteristics can be suitably used in scanning devices of a laser light such as laser printers and bar code readers. The construction of the present invention can also be applied to photonic crystal lasers in various kinds of wavelengths, where, for example, a two-dimensional electrode is attached to each of the three primary colors of blue, green and red in order, and respective color lights are scanned on a screen or the like, so that an application to a full color display is possible.

EXPLANATION OF NUMERALS

11 . . . Semiconductor Laser
12 . . . Polygon Mirror
13, 74 . . . Lens
14, 73 . . . Photoreceptor Drum
21 . . . Active Layer
22 . . . Lower Spacer
23 . . . Two-dimensional Photonic Crystal Layer
24 . . . Hole
25 . . . Confining Layer
26 . . . Lower Cladding Layer
27, 32 . . . Lower Electrode
28 . . . Upper Spacer
29 . . . Upper Cladding Layer
30 . . . Contact Layer
33, 331, 332, 333, 334, 335 . . . Upper Electrode
34 . . . Switch
35 . . . Control Unit
411, 412, 511, 512 . . . Light-emitting Area
42 . . . Area to form Two-dimensional Photonic Crystal 61 . . . Microlens
71, 72 . . . Photonic Crystal Laser Element

BEST MODE FOR CARRYING OUT THE INVENTION

Figure 2:
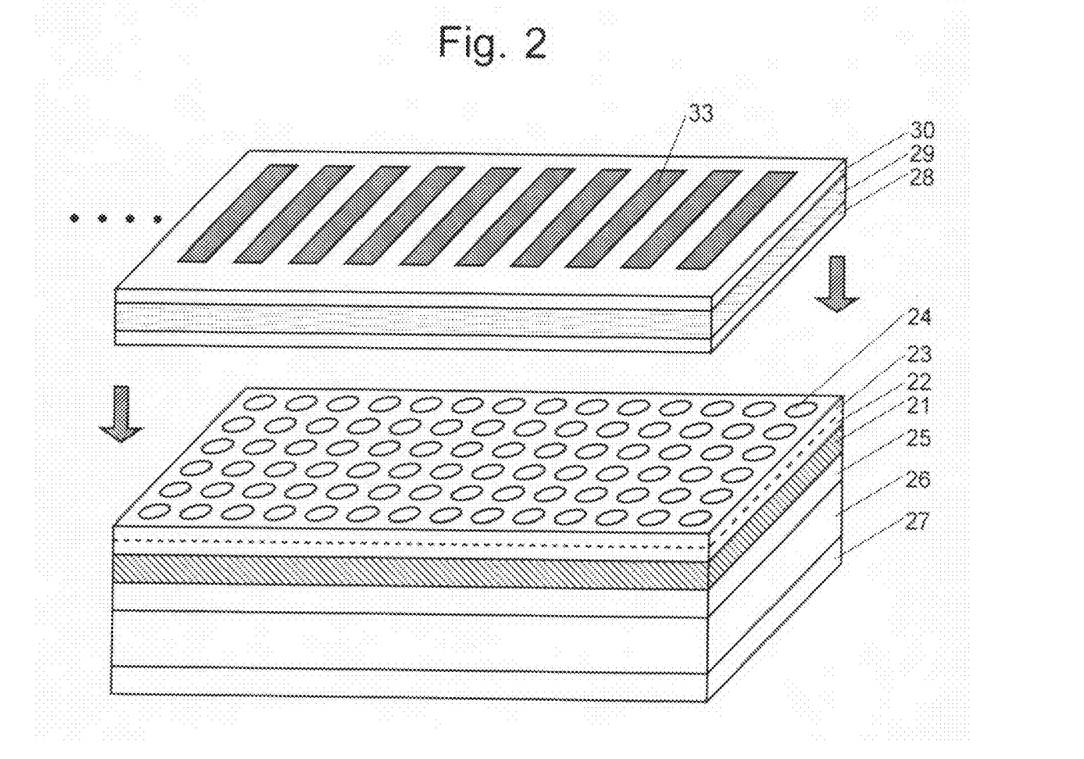
FIG. 2 is a perspective view of a photonic crystal laser element in one embodiment according to the present invention.

An embodiment of the photonic crystal laser element according to the present invention is described referring to FIG. 2.

A two-dimensional photonic crystal 23 is provided on an active layer 21 made of Indium Gallium Arsenide (InGaAs)/Gallium Arsenide (GaAs) and having multiple-quantum wells (MQW) via a lower spacer 22. The two-dimensional photonic crystal 23 includes a plate member made of GaAs and having holes 24 periodically arranged in a square lattice pattern. In the present embodiment, the lower spacer 22 and the two-dimensional photonic crystal layer 23 are created as a single layer, in which the holes 24 are present only in the upper portion thereof in order to function as the two-dimensional photonic crystal layer 23 in the upper portion and function as the lower spacer 22 in the lower portion thereof. On the lower side of the active layer 21, a confining layer 25 made of GaAs, a lower cladding layer 26 made of n-type aluminum gallium arsenide (AlGaAs), and a lower substrate made of n-type GaAs are provided in the descending order from the side closer to the active layer 21. The lower substrate is mechanically grinded to obtain a thickness of about 50 to 100 micrometers, followed by depositing gold, germanium and nickel thereon, which are heated at about 400° C. to be alloyed, making a lower electrode 27. On the upper side of the two-dimensional photonic crystal 23, an upper spacer 28 made of GaAs, an upper cladding layer 29 made of p-type AlGaAs, and a contact layer 30 made of p-type GaAs are provided in the ascending order from the side closer to the two-dimensional photonic crystal 23. Each of these layers can be manufactured by a method similar to that of Patent Document 2.

A large number of upper electrodes 22 are linearly arranged on the contact layer 30. In the present embodiment, the plane shape of upper electrodes 33 is rectangle laid long vertical to the array direction. As the material of the upper electrodes 33, gold can be used, for example. An electrode using gold is capable of suppressing a current loss to a minimum level, and can be manufactured easily by, for example, a deposition method. Alternatively, a transparent electrode made of Zinc Oxide (ZnO) in which carriers are doped may be used in the upper electrodes 33. Using such a transparent electrode allows extraction of a larger amount of light to the outside.

Figure 3:
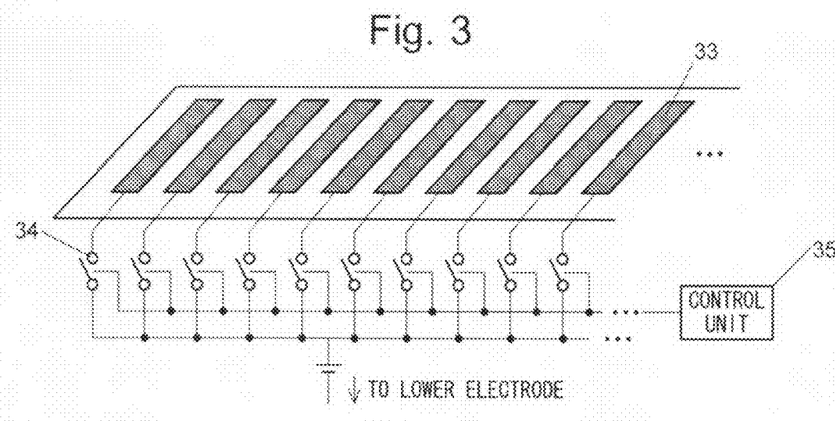
FIG. 3 is a schematic configuration diagram showing a photonic crystal laser device of the present embodiment.

The lower electrode 27 and each of the upper electrodes 33 are connected in parallel to a DC power supply as shown in FIG. 3, where a switch 34 made of a transistor or the like is provided in each of the upper electrodes 33. A control unit 35 is provided to control the on/off of these switches 34. A photonic crystal laser device is thus constructed.

Figure 4:
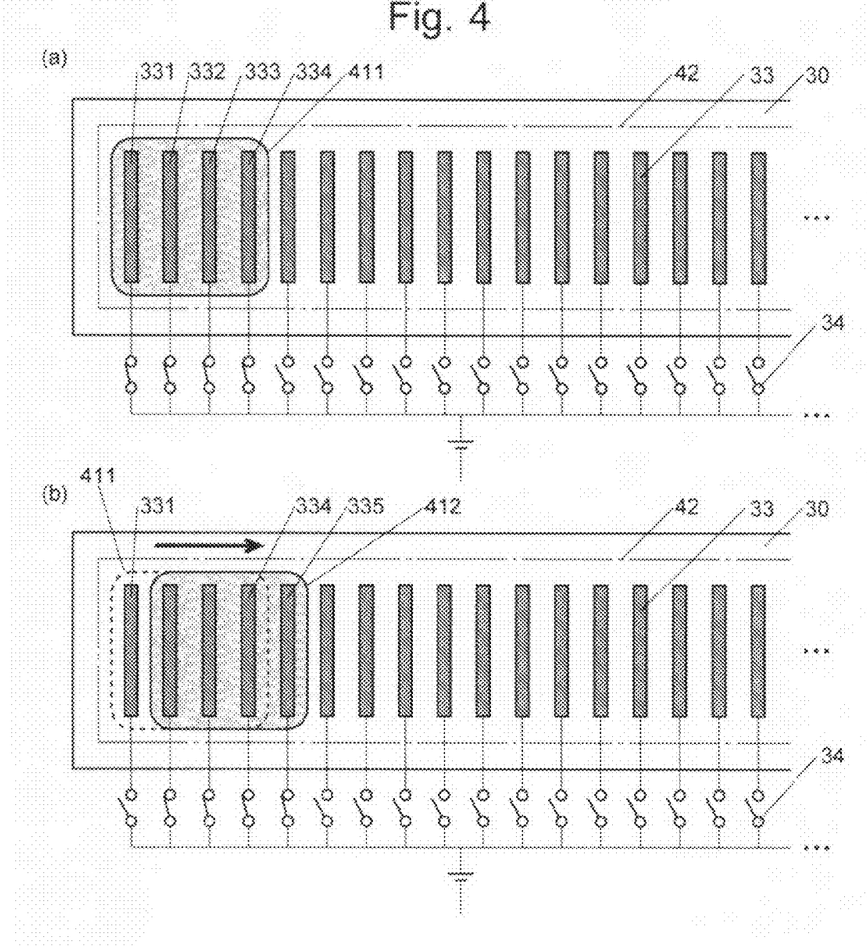
FIG. 4 is a top surface view showing an operation of the photonic crystal laser device of the present embodiment.

The operation of the photonic crystal laser device of the present embodiment is described referring to FIG. 4. First, four electrodes 331 to 334 disposed on one end are formed into one group out of the large number of the arranged upper electrodes 33, and a voltage is applied between the group of these electrodes and the lower electrode to introduce a current. Therefore, carriers are injected in the active layer 21 in the area directly below the four upper electrodes 331 to 334 and the surrounding area, so that light is generated in the area. The light is also introduced into the two-dimensional photonic crystal 23, where the light is diffracted and amplified to produce an oscillation of laser. The two-dimensional photonic crystal 23 is created in the area 42. The laser light is radiated in the direction vertical to the surface of the photonic crystal 23 and emitted from the contact layer 30 to the outside. At this time, the area around the four upper electrodes 331 to 334 in which a current is introduced becomes a light-emitting area 411 as shown in FIG. 4a. In the present embodiment, the light-emitting area 411 has a shape close to a square since the area into which a current is introduced is set to be a shape close to a square while each of the upper electrodes 331 to 334 is shaped long rectangle lying vertical to the array direction.

Next, the current to the leftmost upper electrode 331 in the four electrodes is turned off, and simultaneously a current is introduced to the adjacent upper electrode 335 on the right side (FIG. 4b). This causes the light-emitting area to shift from 411 to 412. The switching of each of the upper electrodes is thus controlled by the control unit 35 and the current-introducing upper electrodes are successively switched, so that the light-emitting area can be shifted in the direction of the array of the upper electrodes 33.

The operation is repeated in such a manner that: the light-emitting area moves from the left end to the right end of the element in almost continuous manner, returns to the left end of the element, and then again moves from the left end to the right end in almost continuous manner. This operation is the same as that of a laser light scan in the laser printer shown in FIG. 1.

The number of upper electrodes into which a current is simultaneously introduced is not limited to four as shown above. For example, a current may be exclusively introduced to each one of the upper electrodes for each time. However, in order to realize a smoother laser light scan, it is desirable to introduce a current to a plurality of the upper electrodes simultaneously and the current is partially turned on/off as stated above. Moreover, while the light-emitting area is controlled to return to the left end of the element immediately after reaching the right end of the element in the above example, the light-emitting area may return to the left end from the right end in the opposite direction after reaching the right end, depending on purposes.

Figure 5:
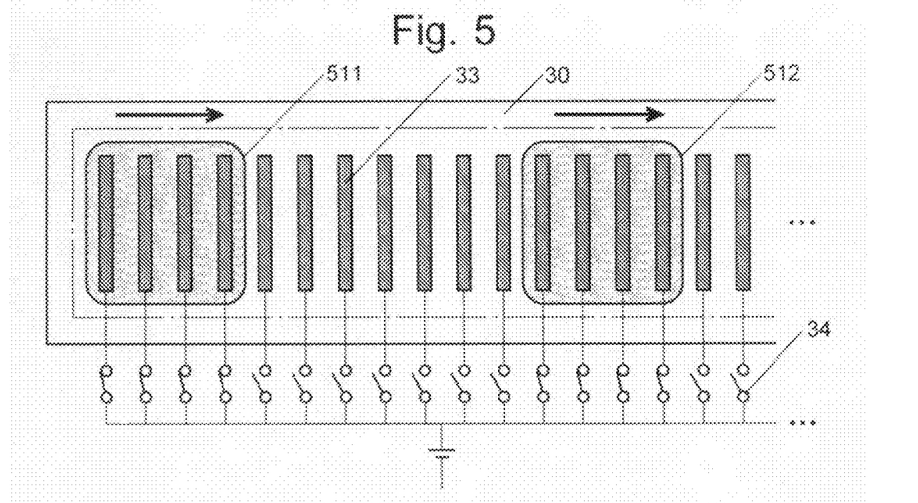
FIG. 5 is a top surface view showing an example of scanning a plurality of light-emitting areas (i.e. beams of a laser light) simultaneously.

Furthermore, as show in FIG. 5, it is possible to create, besides one light-emitting area 511, simultaneously another light-emitting area 512 in a position away from the light-emitting area 511. Similarly, three or more light-emitting areas may be simultaneously created. A simultaneous scan with the plurality of these light emitting areas allows a scan in a shorter period of time within a predetermined area in comparison with a case where a scan is performed with a single light-emitting area.

The shape of the upper electrodes 33 is not limited to a rectangle laid long vertical to the array direction as stated above, and may be, for example, a square or other shape. Moreover, the electrodes may be two-dimensionally arranged to scan a single beam in various directions or scan a plurality of beams simultaneously.

Figure 6:
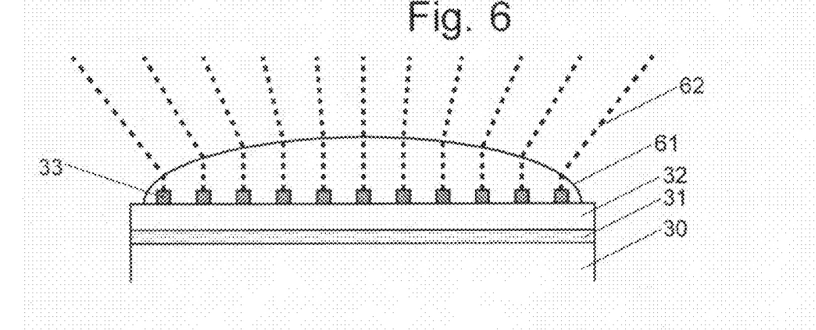
FIG. 6 is a vertical sectional view showing a photonic crystal laser element provided with a means for changing the direction of a laser light in each of upper electrodes.

FIG. 6 shows an example in which a means for changing (or deflecting) the direction of a laser light is provided for each of the upper electrodes 33. In the example of FIG. 6, one lens 61 is provided above the photonic crystal laser element so as to cover the entire upper electrodes 33. Owing to this, the range of a laser light radiation is extended in the array direction of the upper electrodes 33, which allows an expansion of an irradiation area (or scanning area) of a laser light while minimizing the size of the photonic crystal laser element.

Figure 7:
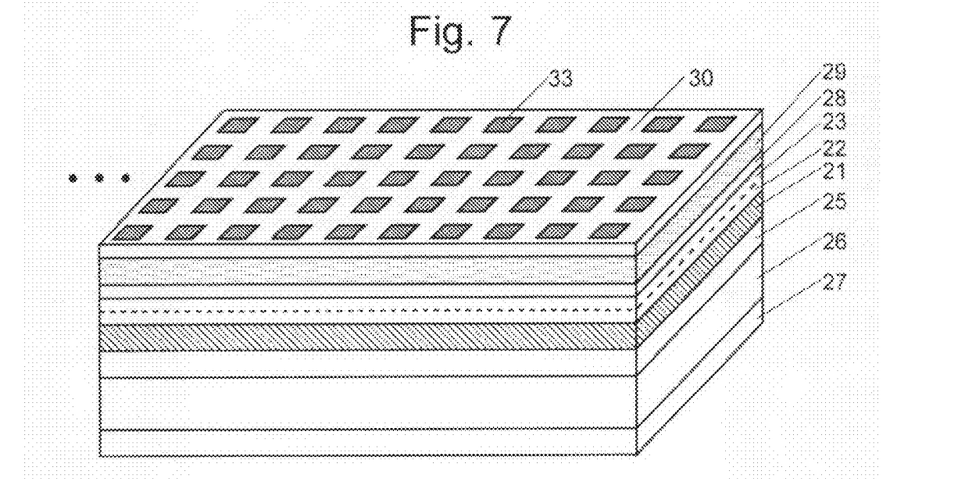
FIG. 7 is a perspective view of the photonic crystal laser element in another embodiment according to the present invention.
Figure 8:
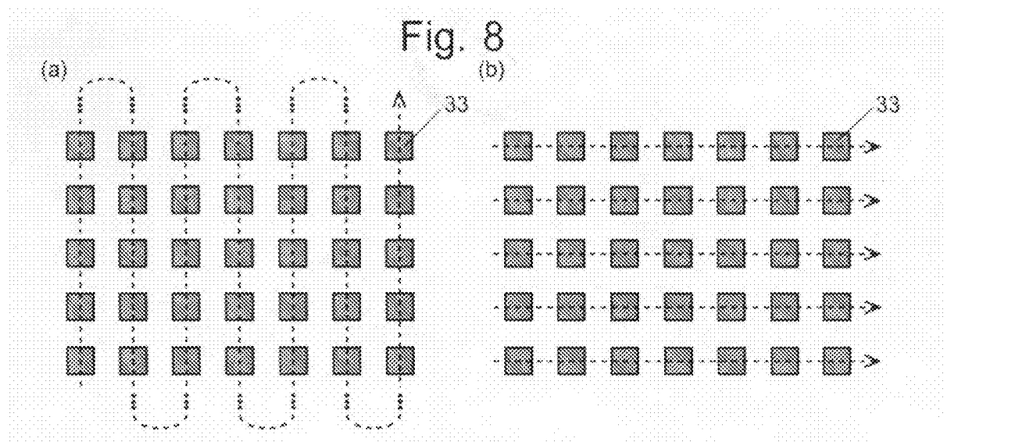
FIG. 8 is a plan view to explain an operation of the photonic crystal laser element of FIG. 7.

Embodiments of the photonic crystal laser element and the photonic crystal laser device according to the present invention are not limited to the above examples. For example, the upper electrodes 33 may be arranged two-dimensionally as shown in FIG. 7. When, in this case, the current-injecting upper electrodes 33 are switched in the order shown by the arrow of FIG. 8a, the light-emitting area can be scanned two-dimensionally. Otherwise, when the current-injecting upper electrodes 33 are switched in each column of the upper electrodes 33 as shown in FIG. 8b, a plurality of laser lights can be scanned simultaneously.

Figure 9:
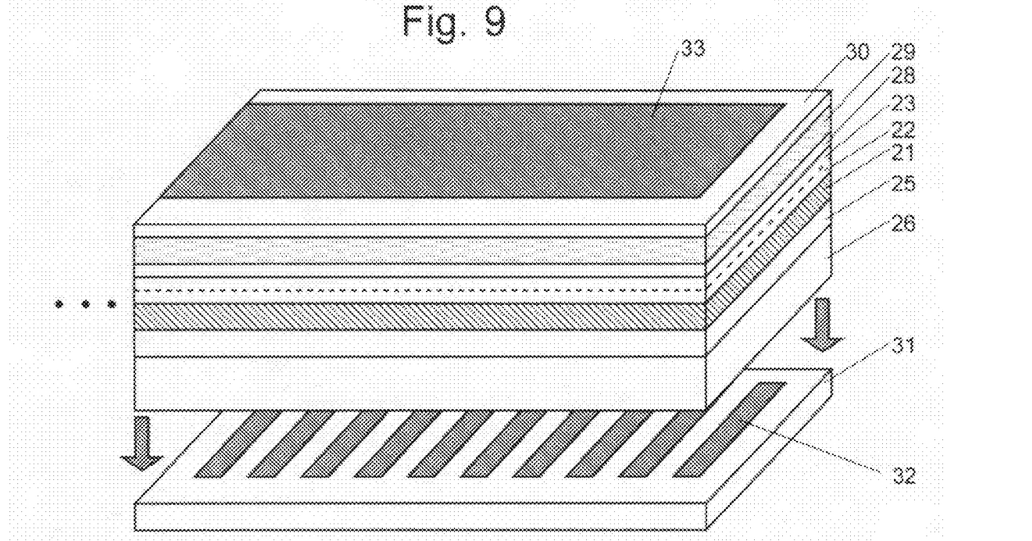
FIG. 9 is a perspective view of the photonic crystal laser element in yet another embodiment according to the present invention.

As shown in FIG. 9, the upper electrodes 33 may be created as a single electrode and the plurality of lower electrodes 32 may be created on the substrate 31. This photonic crystal laser element is operated in the same manner with the above embodiment.

Figure 10:
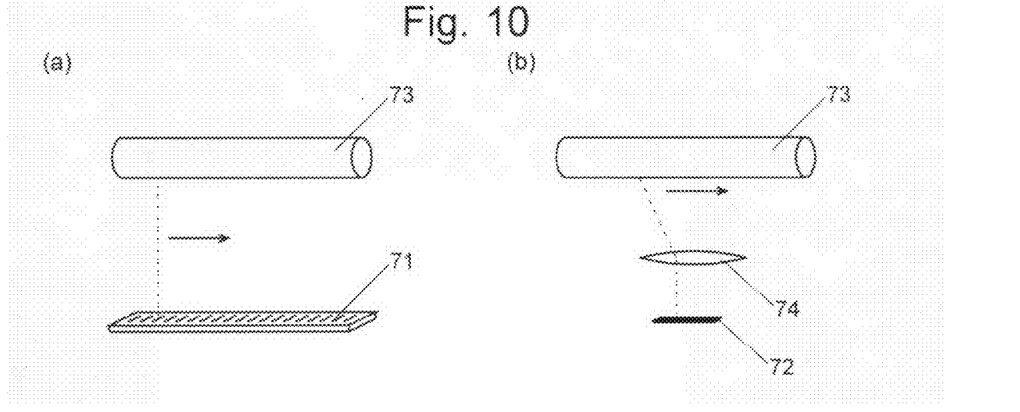
FIG. 10 is a schematic configuration diagram of a laser scanning device in a laser printer using the photonic crystal laser according to the present invention.

FIG. 10 shows an example of using the photonic crystal laser element according to the present invention in a light source unit of a laser printer. In the construction of FIG. 10a, a photonic crystal laser element 71 having the same length as an effective print width of a photoreceptor drum 73 is made and placed in a position facing the photoreceptor drum 73. In this construction, a number of upper electrodes corresponding to the number of dots in the effective print width of the photoreceptor 73 (ex. 12000 pieces when the effective print width of the photoreceptor drum 73 is 10 inch=25.4 cm at 1200 dpi) need to be arranged within the effective print width. Since, in the photonic crystal laser element according to the present invention, the upper electrodes can be made sufficiently small (the arrangement pitch was about 20 µm in the above example) while allowing an oscillation of laser, such a construction is feasible according to the present invention.

In the construction of FIG. 10b, a photonic crystal laser element 72 shorter than the effective print width of the photoreceptor drum 73 and having the same number of upper electrodes as the above example is made and placed in a position facing the photoreceptor drum 73. Suppose, for example, the size (or length) of the photonic crystal laser element 72 is ⅒ of the effective print width of the photoreceptor drum 73 (i.e. 2.54 cm in the above example), the pitch to arrange the upper electrodes is about 2 µm, which is possible enough by using a short wavelength laser. In this construction, the lens 61 is arranged on the photonic crystal laser element as shown in FIG. 6, or a lens 74 is provided separately from the photonic crystal laser element and placed between the photonic crystal laser element light source and the photoreceptor drum 73, in order to expand a laser light from the photonic crystal laser element in a wide range.

In either construction, a light emission control of a laser light is made by controlling on/off of the voltage applied to each of the upper electrodes in the photonic crystal laser element light source, so that a laser light scan is performed on the photoreceptor drum 73 in the same manner as the conventional laser printers. An electronic scanning process can be thus achieved without using a polygon mirror, which allows a significantly high-speed printing process.

The invention claimed is:

1. A photonic crystal laser device, comprising:
  a photonic crystal laser element which includes:
    a) an active layer for generating light of a predetermined wavelength by an injection of electric charges;
    b) a two-dimensional photonic crystal provided on an upper side of the active layer and having a periodic structure corresponding to the predetermined wavelength;
    c) a plurality of upper electrodes arranged on an upper side of the two-dimensional photonic crystal; and
    d) one or more lower electrodes provided on a lower side of the active layer;
  a voltage application means for applying a voltage between the upper electrode and the lower electrode; and a control means for turning the voltage on or off successively in the array order of the plurality of the upper electrodes or the lower electrodes and applying the same voltage simultaneously to a group made of at least three adjacent upper electrodes or lower electrodes, wherein:
the voltage application to each successive group of electrodes is substantially the same.

2. A photonic crystal laser device, comprising:
a photonic crystal laser element, which includes:
   a) an active layer for generating light of a predetermined wavelength by an injection of electric charges;
   b) a two-dimensional photonic crystal provided on an upper side of the active layer and having a periodic structure corresponding to the predetermined wavelength;
   c) one or more upper electrodes provided on an upper side of the two-dimensional photonic crystal; and
   d) a plurality of lower electrodes arranged on a lower side of the active layer;
a voltage application means for applying a voltage between the upper electrode and the lower electrode; and
a control means for turning the voltage on or off successively in the array order of the plurality of the upper electrodes or the lower electrodes and applying the same voltage simultaneously to a group made of at least three adjacent upper electrodes or lower electrodes, wherein:
the voltage application to each successive group of electrodes is substantially the same.

3. The photonic crystal laser device according to claim 1, wherein the plurality of the upper electrodes or the lower electrodes are arranged linearly.

4. The photonic crystal laser device according to claim 1, wherein the plurality of the upper electrodes or the lower electrodes are arranged two-dimensionally.

5. The photonic crystal laser device according to claim 1, wherein the upper electrode is made of a transparent material with respect to the light of the predetermined wavelength.

6. The photonic crystal laser device according to claim 1, wherein a means for deflecting an outputted laser light is provided on the upper electrode.

7. The photonic crystal laser device according to claim 1, wherein the control means shifts the group successively.

8. A laser printer, comprising the photonic crystal laser device according to claim 1 as a light source.

9. The photonic crystal laser device according to claim 2, wherein the plurality of the upper electrodes or the lower electrodes are arranged linearly.

10. The photonic crystal laser device according to claim 2, wherein the plurality of the upper electrodes or the lower electrodes are arranged two-dimensionally.

11. The photonic crystal laser device according to claim 2, wherein the upper electrode is made of a transparent material with respect to the light of the predetermined wavelength.

12. The photonic crystal laser device according to claim 2, wherein a means for deflecting an outputted laser light is provided on the upper electrode.

13. The photonic crystal laser device according to claim 2, wherein the control means shifts the group successively.

14. A laser printer, comprising the photonic crystal laser device according to claim 2 as a light source.

* * * * *